United States Patent [19]
Byrne et al.

[11] Patent Number: 5,924,877
[45] Date of Patent: Jul. 20, 1999

[54] GROUND CONNECTOR FOR RACK-MOUNT MODULES AND METHODS OF OPERATION AND MANUFACTURE THEREFOR

[75] Inventors: Vincent M. Byrne, Mesquite; Roosevelt O. Carr, Plano; James C. Moran, Dallas; Stephen P. Wurmlinger, Scurry, all of Tex.

[73] Assignee: Lucent Technologies Inc., Murray Hill, N.J.

[21] Appl. No.: 08/799,519

[22] Filed: Feb. 12, 1997

[51] Int. Cl.⁶ .............................. H01R 4/66; H01R 13/648
[52] U.S. Cl. .............................. 439/101; 439/92; 361/727
[58] Field of Search .............................. 439/92, 101, 106, 439/97; 361/724, 725, 727

[56] References Cited

U.S. PATENT DOCUMENTS

| | | | |
|---|---|---|---|
| 5,007,848 | 4/1991 | Lee | 439/101 |
| 5,311,408 | 5/1994 | Ferchau et al. | 361/800 |

Primary Examiner—Paula Bradley
Assistant Examiner—Katrina Davis

[57] ABSTRACT

A grounding connector for use in a rack for receiving at least one module, the module rack having a power outlet associated therewith, the power outlet having a ground receptacle and power receptacles, a connector to allow a module insertable into the rack to be grounded via the power outlet and methods of operation and manufacture therefor. The connector includes: (1) a bracket coupled to a chassis of the module and (2) a ground pin coupled to the bracket and projecting from the chassis to engage and make an electrical connection within the ground receptacle, the connector remaining disengaged and electrically disconnected from the power receptacles thereby to prevent electrical power from being transmitted from within the power outlet.

20 Claims, 3 Drawing Sheets

5,924,877

GROUND CONNECTOR FOR RACK-MOUNT MODULES AND METHODS OF OPERATION AND MANUFACTURE THEREFOR

TECHNICAL FIELD OF THE INVENTION

The present invention is directed, in general, to power supplies and, more specifically, to a ground connector for a power module and methods of operating and manufacturing the ground connector.

BACKGROUND OF THE INVENTION

A rack-mount system, having a plurality of bays into which modules can be inserted, is a commonly-used structure for coupling separate power supply modules together to provide a complete system. Typically, each power supply module has its own input requirements and output capabilities. A power supply is a device used to convert electrical energy from one form to another (e.g., converting an alternating current ("AC") to direct current ("DC"), or vice versa, or to transform an AC or DC voltage to a different level). A power system may consist of one or more power supplies, which can be operated in parallel to provide greater energy capacity. For example, two AC-to-DC converters, each capable of providing 20 amps of current at a particular output voltage, can be coupled in parallel to provide 40 amps of current. A rack-mount system is also often used in the telecommunications industry to house various system modules, including AC-to-DC rectifiers, DC-to-DC converters, "ringer" modules, etc.

A rack-mount system typically includes a bus structure that includes a power outlet to couple a module inserted into the rack to a source of AC power. Each power outlet includes power receptacles (e.g., "hot" and "neutral") and a "ground" receptacle. Conventional rack-mount modules are constructed such that they can be easily inserted into a rack-mount bay. To facilitate quick installation, prior art modules have included a conventional AC power connector, positioned at the rear of the module, that automatically engages an AC power outlet in the rack as the module is inserted. To comply with safety standards, such as those promulgated by Underwriter's Laboratories ("UL"), all modules must be coupled to the ground. Some modules employed in a rack-mount system, however, do not require AC power. Thus, although all modules must be coupled to the ground, the use of a conventional AC power connector for all modules is unnecessary.

If a conventional AC power connector is used in a rack-mount module that does not require AC power, live AC power will unnecessarily be present within the module. Furthermore, conventional AC power connectors include prongs for engaging with the power receptacles, and thus the connectors must include a means to insulate the prongs from the module chassis. Thus, the connectors are typically manufactured from an insulating plastic. However, because the plastic housing also insulates the grounding prong (or "pin"), a separate grounding strap is required to couple the grounding prong of the connector to the power module chassis. Additional disadvantages of using a conventional AC power connector in rack-mount modules that do not require AC power include additional manufacturing time, additional parts count and cost, and loss of space within the module chassis.

Accordingly, what is needed in the art is a connector to allow a rack-mount module to be grounded through a power outlet in a rack-mount system; the connector should remain disengaged and electrically disconnected from the AC power receptacles within the power outlet in the rack-mount system thereby to prevent the AC power from being coupled into the module.

SUMMARY OF THE INVENTION

To address the above-discussed deficiencies of the prior art, the present invention provides, for use in a rack for receiving at least one module, the module rack having a power outlet associated therewith, the power outlet having a ground receptacle and power receptacles, a connector to allow a module insertable into the rack to be grounded via the power outlet and methods of operation and manufacture therefor. The connector includes: (1) a bracket coupled to a chassis of the module and (2) a ground pin coupled to the bracket and projecting from the chassis to engage and make an electrical connection within the ground receptacle, the connector remaining disengaged and electrically disconnected from the power receptacles thereby to prevent electrical power from being transmitted from within the power outlet.

The present invention therefore provides a safer and less expensive way to provide a ground for a rack-mountable module that falls within established UL guidelines.

In one embodiment of the present invention, the power outlet is a standard female International Electrotechnical Commission ("IEC") power connector. IEC connectors are characterized by three receptacles; two for power, hot and neutral, and one for a ground. Those skilled in the art will recognize, however, that the present invention may be employed with other standard connectors having both power and ground receptacles.

In one embodiment of the present invention, the bracket provides a path for electrical current flowing between the chassis and the ground receptacle. The bracket may be composed of a conductive material and therefore provide the path itself or may have a conductive trace or other path integral therewith for providing the path. Alternatively, a separate conductive lead may couple the ground pin to the chassis.

In one embodiment of the present invention, the connector is recessed into a wall (preferably the rear wall) of the chassis. This decreases the risk that the ground pin will be exposed to bending forces. Those skilled in the art will recognize, however, that the connector need not be recessed into the wall.

In one embodiment of the present invention, the bracket and the ground pin are formed from a single piece of conductive material. In this embodiment, a single bent metal bracket is employed to provide the complete ground path from the chassis to the ground receptacle. The connector may, however, be formed of multiple piece parts.

In one embodiment of the present invention, the ground pin is composed of a copper alloy. In the embodiment to be illustrated and described, the connector as a whole is composed of copper alloy, allowing the connector to provide the complete ground path from the chassis to the ground receptacle. Those skilled in the art should understand that the broad scope of the present invention is not limited by the material composition of the connector or components (e.g., the ground pin) thereof.

In one embodiment of the present invention, the bracket is a separate piece from the chassis, the module comprising at least one fastener that mechanically connects the bracket to the chassis. The bracket or, for that matter, the entire connector may be a single piece with the chassis of the module.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

DETAILED DESCRIPTION

Figure 1:
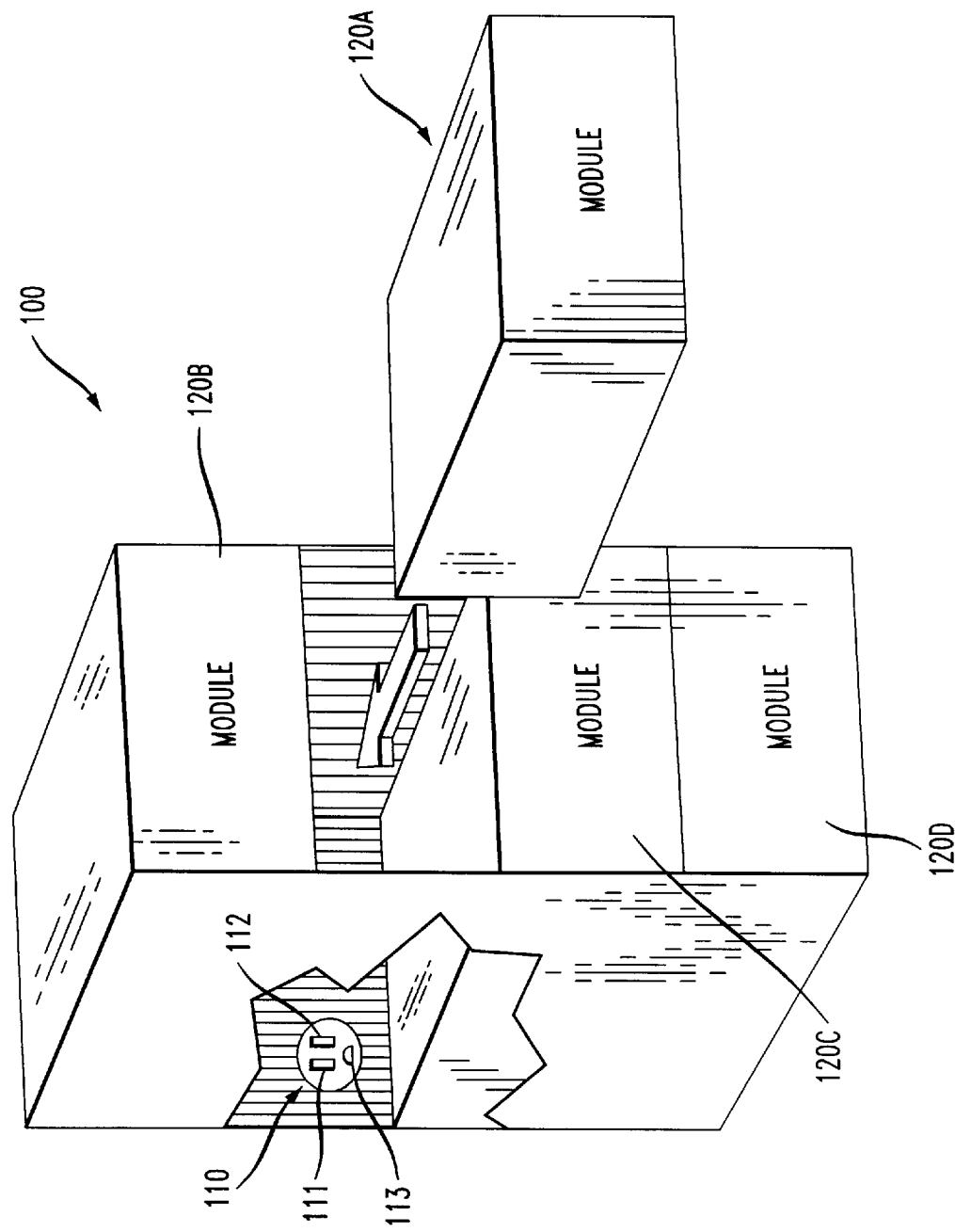
FIG. 1 illustrates an embodiment of a rack-mount system having AC power outlets for engaging with and providing AC power to modules inserted therein.

Referring initially to FIG. 1, illustrated is an embodiment of a rack-mount system 100 having AC power outlets 110 (only one is shown) for engaging with and providing AC power to modules 120A, 120B, 120C, 120D inserted therein. The rack-mount system 100 includes a bus structure (not shown) that distributes AC power to the AC power outlet 110 in each rack-mount bay. Each AC power outlet 110 includes power receptacles 111, 112 (e.g., "hot" and "neutral") and a "ground" receptacle 113. When a module 120A is inserted into the rack-mount system 100, a connector (not shown) on the rear of the module automatically engages with the AC power outlet 110. As previously mentioned, the prior art modules use a conventional AC power connector even for those modules that do not require AC power. To comply with safety standards, such as those promulgated by Underwriter's Laboratories ("UL"), however, all modules 120A, 120B, 120C, 120D must be coupled to the ground receptacle 113. While the description of the present invention will, in the most part, be with respect to a single module 120A, it should be understood that the principles equally apply to the other modules 120B, 120C, 120D.

Figure 2:
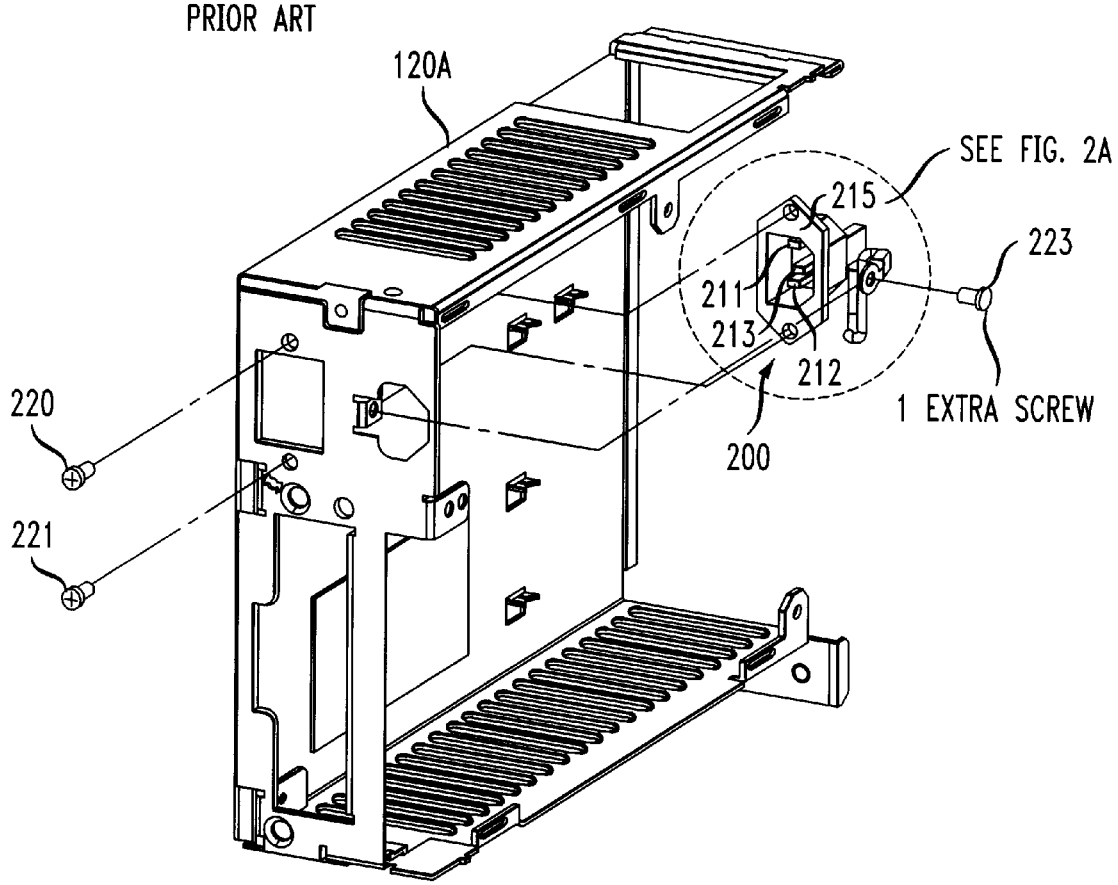
FIG. 2 illustrates a prior art connector used to couple a rack-mount module, that does not require AC power, to a ground receptacle in a rack-mount system.
Figure 2A:
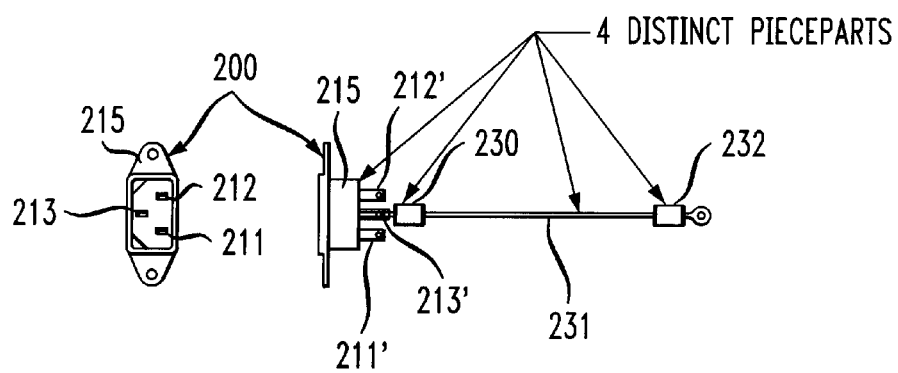

Turning now to FIG. 2, and with continuing reference to FIG. 1, illustrated is a prior art connector 200 used to couple a rack-mount module 120A (only a bare chassis is illustrated) that does not require AC power to a ground receptacle 113 in a rack-mount system 100. The connector 200 is a conventional design, having prongs 211, 212 for insertion into power receptacles 111, 112 (e.g., "hot" and "neutral"), respectively, as well as a ground pin 213 for insertion into the ground receptacle 113. A plurality of screws 220, 221 couple the connector 200 to the chassis of rack-mount module 120A.

The connector 200 has a body 215, constructed from an insulating material, that rigidly holds prongs 211, 212, 213 in a fixed positional relationship. The prongs 211, 212, 213 are in electrical communication with tabs 211', 212', 213', respectively, on an opposing face of the body 215; the tabs 211', 212', 213' provide a means to couple the electrical power and ground to circuits contained within the rack-mount module 120A. When a module 120A employing the connector 200 is inserted into the rack-mount system 100, the pins 211, 212 engage with the power receptacles 111, 112 and, undesirably provide a source of exposed AC power (via the tabs 211', 212') within the modules that do not require AC power.

Due to the fact that the insulating material of body 215 also insulates the ground pin 213 (and associated tab 213'), a "grounding strap" must be used to couple the ground pin 213 to the chassis of the rack-mount module 120A. A typical ground strap consists of a wire 231 having a connector 230 coupled to one end thereof, and a ring terminal 232 coupled to an opposite end thereof. The connector 230 provides a means of attaching the ground strap to the tab 213'; a screw 223, through ring terminal 232, secures the ground strap to the chassis of rack-mount module 120A.

From the foregoing it can be observed that multiple components (namely, the connector 200, wire 231, connector 230, ring terminal 232 and screws 220, 221, 233) are necessary to couple the rack-mount module 120A to the ground receptacle 113 of an AC power outlet 110 in rack-mount system 100.

Figure 3:
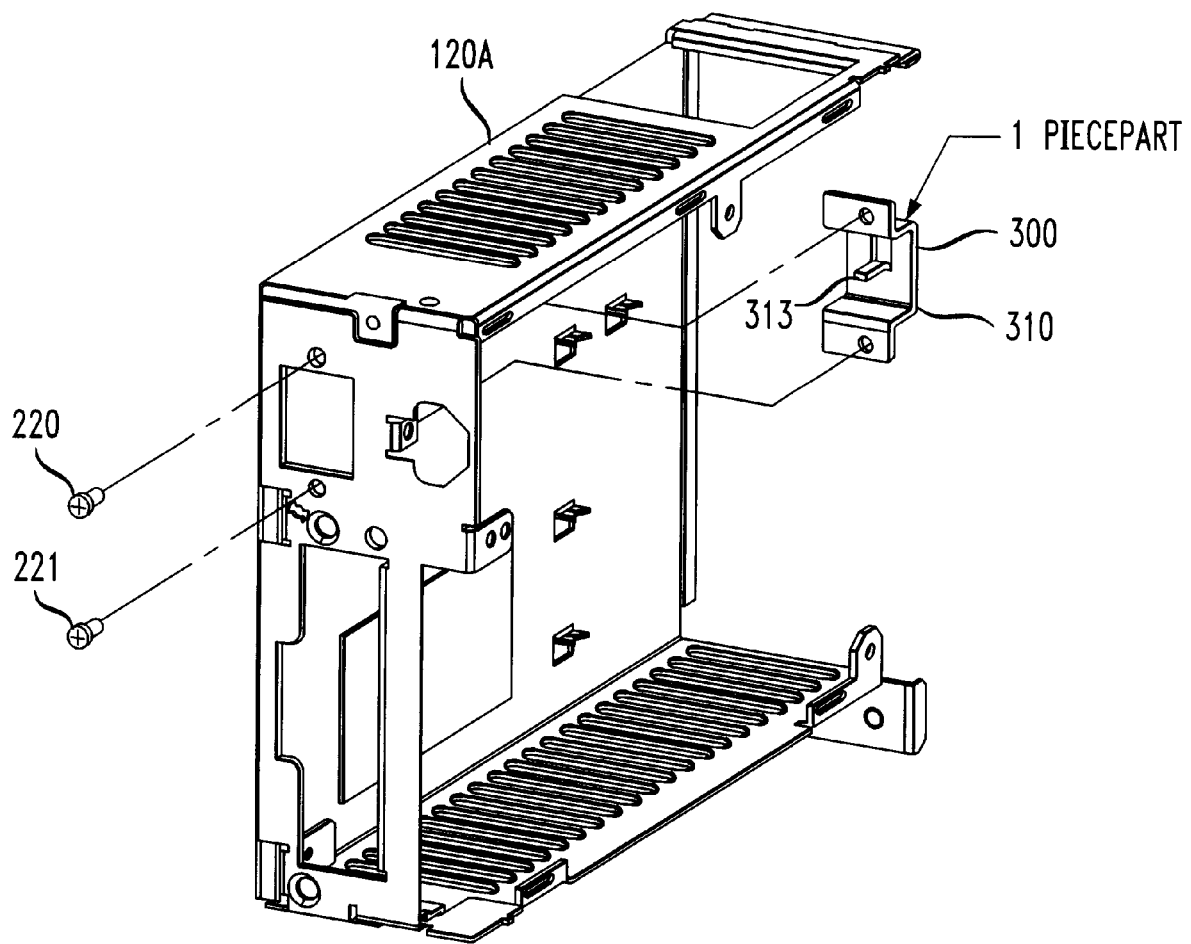
FIG. 3 illustrates an embodiment of a connector constructed according to the principles of the present invention.

Turning now to FIG. 3, illustrated is an embodiment of a connector 300 constructed according to the principles of the present invention. With continuing reference to FIG. 1, the connector 300 allows the rack-mount module 120A to be grounded through the AC power outlet 110 in the rack-mount system 100; the connector 300 remains disengaged and electrically disconnected from AC power. In the present embodiment, the connector 300 includes: (1) a bracket 310 for coupling the connector 300 to the chassis of the rack-mount module 120A and (2) a ground pin 313, coupled to the bracket 310, that projects from the chassis to engage and make an electrical connection within the ground receptacle 113 of the AC power outlet 110 in the rack-mount system 100, the connector 300 remaining disengaged and electrically disconnected from the power receptacles 111, 112, thereby preventing electrical power from being transmitted from the power outlet 110 to the interior of the rack-mount module 120A.

In the illustrated embodiment, the bracket 310 provides a path for the electrical current to flow between the chassis of the rack-mount module 120A and the ground receptacle 113 of the AC power outlet 110 in the rack-mount system 100. The bracket 310 may be composed of a conductive material and therefore provide the path itself, or the bracket may have a conductive trace or other path integral therewith for coupling the module 120A to the ground receptacle 113. Alternatively, a separate conductive lead (not shown) may electrically couple the ground pin 313 to the chassis of the module 120A.

The connector 300 is coupled to the chassis of the rack-mount module 120A by the screws 220, 221. In an alternate embodiment, the bracket 310 or, for that matter, the entire connector 300, may be integrally formed with the chassis of the rack-mount module 120A, thereby eliminating the need for the screws 220, 221. Those skilled in the art are familiar with the capability to bend and form sheet metal into complex forms. It should be clear that the scope of the present invention is not limited to the illustrated connector 300; the ground pin of a connector, however, should be electrically couplable to the chassis of a rack-mount module, and fixedly-positioned with respect thereto, to engage a ground receptacle when inserted in a rack-mount system.

From the foregoing it can be observed that only three components (namely, the connector 300 and screws 220, 221) are necessary to couple the rack-mount module 120A to the ground receptacle 113 of an AC power outlet 110 in rack-mount system 100. This compares favorably to the prior art connectors where many more components where required thereby resulting in additional manufacturing time, additional cost, and loss of available space within the module.

In an alternative embodiment of the present invention, the power outlet 110 in the rack-mount system 100 is a standard female IEC power connector; the dimensions for connector 300 are selected such that the ground pin 313 engages the ground receptacle 113 in the power outlet 110 when the rack-mount module 120A is inserted in the rack-mount system 100. Analogous to a conventional male IEC power connector, the connector 300 may engage the standard female IEC power connector even if the connector 300 is recessed in a wall of the module 120A. Of course, the broad scope of the present invention is not limited to the structure of the connector 300 as illustrated herein. Also, those skilled in the art should recognize that the present invention may be employed with other standard, and non-standard, connectors having both power and ground receptacles.

The bracket 310 and the ground pin 313 is formed from a single piece of conductive material. A single bent metal bracket is employed to provide the complete ground path from the chassis of the rack-mount module 120A to the ground receptacle 113. The use of a single piece of conductive material has the advantage of reducing the number of parts and cost of manufacture of module 120A. The connector may, however, be formed of multiple piece parts.

The connector 300 is recessed into a wall (preferably the rear wall) of the rack-mount module 120A chassis, thereby minimizing the risk that the ground pin 313 will be exposed to bending forces. Those skilled in the art will recognize, however, that the connector 300 need not be recessed into the rear wall.

The ground pin 313 has dimensions complying with IEC tolerances, and the connector 300 is preferably composed of copper alloy with tin plating. The tin plating minimizes the risk of corrosion between the connector 300 and the zinc-plated steel used for the chassis of the rack-mount module 120A. Those skilled in the art will readily perceive of other material compositions and combinations suitable for use in particular applications. The principles of the present invention are not limited to a particular material, or combination of materials, used to manufacture the connector 300 or the chassis of the rack-mount module 120A.

Although the present invention has been described in detail, those skilled in the art should understand that they can make various changes, substitutions and alterations herein without departing from the spirit and scope of the invention in its broadest form.

What is claimed is:

1. A connector for use in a rack for receiving at least one module, said module rack having a power outlet associated therewith, said power outlet having a ground receptacle and power receptacles, a connector to allow a module insertable into said rack to be grounded via said power outlet, comprising:
   a bracket coupled to a chassis of said module; and
   a ground pin coupled to said bracket and projecting from said chassis to engage and make an electrical connection within said ground receptacle, said connector remaining disengaged and electrically disconnected from said power receptacles thereby to prevent electrical power from being transmitted from within said power outlet.

2. The connector as recited in claim 1 wherein said power outlet is a female IEC power connector.

3. The connector as recited in claim 1 wherein said bracket provides a path for electrical current flowing between said chassis and said ground receptacle.

4. The connector as recited in claim 1 wherein said connector is recessed into a wall of said chassis.

5. The connector as recited in claim 1 wherein said bracket and said ground pin are formed from a single piece of conductive material.

6. The connector as recited in claim 1 wherein said ground pin is composed of a copper alloy.

7. The connector as recited in claim 1 wherein said bracket is a separate piece from said chassis, said module comprising at least one fastener that mechanically connects said bracket to said chassis.

8. A connector for use in a rack for receiving at least one module, said module rack having a power outlet associated therewith, said power outlet having a ground receptacle and power receptacles, a method of allowing a module insertable into said rack to be grounded via said power outlet, comprising the steps of:
   inserting said module into said rack, a bracket coupled to a chassis of said module aligning with said power outlet; and
   engaging and making an electrical connection within said ground receptacle with a ground pin coupled to said bracket and projecting from said chassis, said connector remaining disengaged and electrically disconnected from said power receptacles thereby to prevent electrical power from being transmitted from within said power outlet.

9. The method as recited in claim 8 wherein said power outlet is a female IEC power connector.

10. The method as recited in claim 8 further comprising the step of providing a path for electrical current flowing between said chassis and said ground receptacle with said bracket.

11. The method as recited in claim 8 wherein said connector is recessed into a wall of said chassis.

12. The method as recited in claim 8 wherein said bracket and said ground pin are formed from a single piece of conductive material.

13. The method as recited in claim 8 wherein said ground pin is composed of a copper alloy.

14. The method as recited in claim 8 wherein said bracket is a separate piece from said chassis, said module comprising at least one fastener that mechanically connects said bracket to said chassis.

15. A connector for use in a rack for receiving at least one module, said module rack having a power outlet associated therewith, said power outlet having a ground receptacle and power receptacles, a method of manufacturing a module such that said module is insertable into said rack and groundable via said power outlet, comprising the steps of:
   forming a bracket having a ground pin; and
   coupling said bracket to a chassis of said module, said ground pin projecting from said chassis and engageable with said ground receptacle for making an electrical connection therewith, said connector remaining disengaged and electrically disconnected from said power receptacles thereby to prevent electrical power from being transmitted from within said power outlet.

16. The method as recited in claim 15 wherein said power outlet is a female IEC power connector.

17. The method as recited in claim 15 further comprising the step of providing a path for electrical current flowing between said chassis and said ground receptacle with said bracket.

18. A rack, comprising:
a wall having a plurality of female IEC power connectors associated therewith; and a plurality of modules, each including:
  a chassis, and
  a mating connector to allow each of said plurality of modules to be grounded via said power connector and having a conductive bracket coupled to said chassis and a ground pin coupled to said bracket and projecting from said chassis to engage and make an electrical connection within a ground receptacle of one of said plurality of power connectors, said mating connector remaining disengaged and electrically disconnected from power receptacles thereby preventing electrical power from being transmitted from within said one of said plurality of power connectors, said bracket providing a path for electrical current flowing between said chassis and said ground receptacle.

19. The rack as recited in claim 18 wherein said connector is recessed into a wall of said chassis.

20. The rack as recited in claim 18 wherein said bracket is a separate piece from said chassis, said each of said plurality of modules further including at least one fastener that mechanically connects said bracket to said chassis.

* * * * *